United States Patent
Tsai et al.

(10) Patent No.: US 7,250,683 B2
(45) Date of Patent: Jul. 31, 2007

(54) METHOD TO SOLVE VIA POISONING FOR POROUS LOW-K DIELECTRIC

(75) Inventors: Ming-Hsing Tsai, Taipei (TW); Jing-Cheng Lin, Hsin-Chu (TW); Shau-Lin Shue, Hsin-Chu (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 170 days.

(21) Appl. No.: 11/056,758

(22) Filed: Feb. 11, 2005

(65) Prior Publication Data

US 2005/0170648 A1 Aug. 4, 2005

Related U.S. Application Data

(62) Division of application No. 09/863,224, filed on May 24, 2001, now Pat. No. 6,878,615.

(51) Int. Cl.
*H01L 23/48* (2006.01)
*H01L 23/52* (2006.01)
*H01L 29/40* (2006.01)

(52) U.S. Cl. .................. 257/774; 257/642; 257/758
(58) Field of Classification Search ............. 257/642, 257/758, 774
See application file for complete search history.

(56) References Cited

U.S. PATENT DOCUMENTS

| | | |
|---|---|---|
| 5,916,823 A | 6/1999 | Lou et al. |
| 6,074,942 A | 6/2000 | Lou |
| 6,140,220 A | 10/2000 | Lin |
| 6,291,333 B1 | 9/2001 | Lou |
| 6,358,842 B1 | 3/2002 | Zhou et al. |
| 6,518,166 B1 | 2/2003 | Chen et al. |
| 6,569,760 B1 | 5/2003 | Lin et al. |
| 2002/0127876 A1 | 9/2002 | Eissa et al. |

*Primary Examiner*—Fernando L. Toledo
(74) *Attorney, Agent, or Firm*—Haynes and Boone, LLP

(57) ABSTRACT

A method of forming a via in a low-k dielectric material and without the attendant via poisoning problem, or a dual damascene structure formed in the same dielectric and without the same problem are disclosed. The vertical walls of the via opening are first lined with a low-k protection layer and then covered with a barrier layer in order to prevent outgassing from the low-k dielectric material when copper is deposited into the via opening. In the case of a dual damascene structure, it is sufficient that the hole opening underlying the trench opening is first lined with the low-k protection layer. The resulting via or dual damascene structure is free of poisoned metal and, therefore, more reliable.

14 Claims, 5 Drawing Sheets

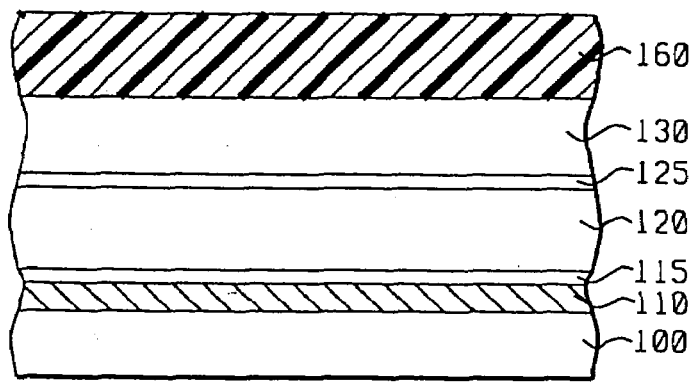
FIG. 1a - Prior Art
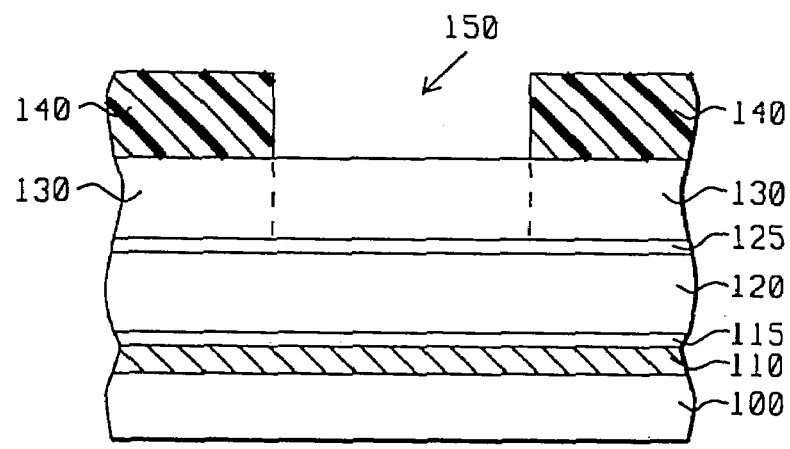
FIG. 1b - Prior Art
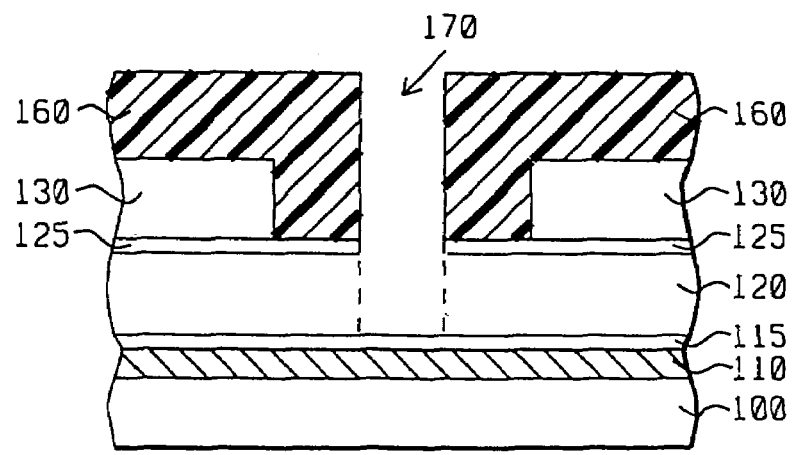
FIG. 1c - Prior Art

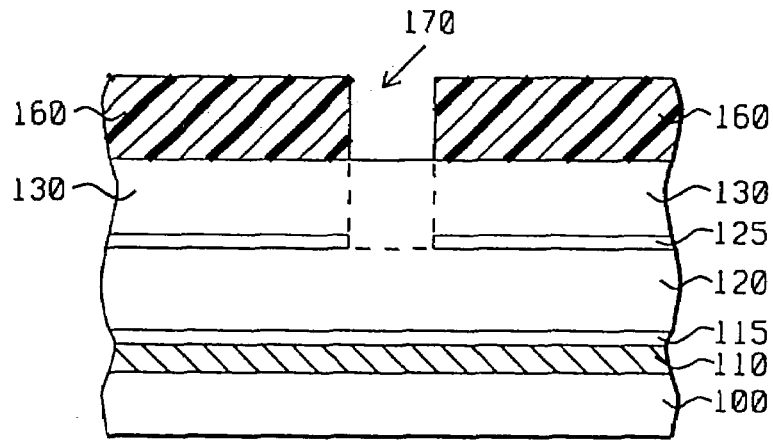
FIG. 1d – Prior Art
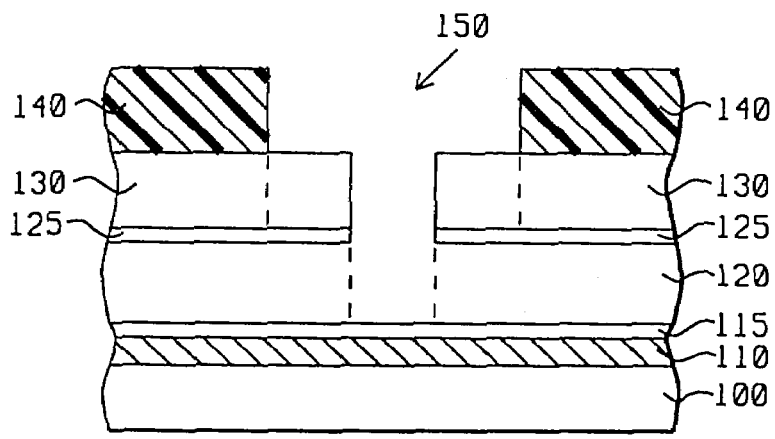
FIG. 1e – Prior Art
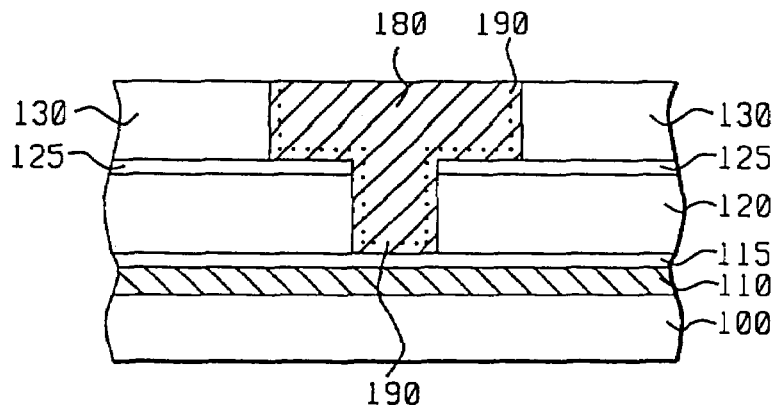
FIG. 1f – Prior Art

METHOD TO SOLVE VIA POISONING FOR POROUS LOW-K DIELECTRIC

BACKGROUND OF THE INVENTION (1) Field of the Invention

The present invention relates to the manufacture of semiconductor devices in general, and in particular, to a method of reducing via poisoning in low-k dielectric materials through the use of a protective metal layer.

(2) Description of the Related Art

Low-k dielectric materials are favored in the semiconductor industry because they have low dielectric constant (k) and therefore, are useful in reducing the resistance-capacitance (RC) delay, or, time constant, of the circuitry in which they are used. However, low-k dielectrics are usually porous, and can trap moisture and other contaminants, thereby giving rise to poisoned interconnects, or vias, as is known in the art, during the process of manufacturing integrated circuit chips. The present invention discloses a method of preventing such poisoned vias.

Copper dual damascene is a preferred interconnect because, as is well known in the art, copper has lower resistivity than the commonly used aluminum and, therefore contributes to lower RC delay. The damascene process also provides a better control of the metal line geometries, as described below, and therefore improves further the RC characteristics of the lines. However, if the damascene structure is not properly protected during forming of the contact and via holes, the holes can be "poisoned" due to outgassing from the insulative layers, and/or due to the hydrophobic nature of the insulative layers. A poisoned contact hole (reaching the substrate), or a poisoned via hole (connecting different metallized layers) can give rise to voids, cavities for contaminants to enter, poor interfaces between contacting conductors, and, hence, poor connections between interconnects. It is disclosed later in the embodiments of the present invention a method of providing a protective layer over the insulative low-k dielectric to prevent entrapment of any contaminants which may give rise to poisoning of the interconnects. The method is especially well-suited for damascene interconnects.

Copper dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, trenches and holes in appropriate locations in the trenches are formed in an insulative material by etching, which are then filled with metal. Metal in trenches form the horizontal metal line interconnects while the metal in the underlying holes form the vertical connections to the layers of metal interconnects formed in the previous damascene structure.

Thus, in a single damascene semiconductor manufacturing process, incisions, or trenches, are formed in an insulative layer and filled with metal to form conductive lines. Dual damascene takes the process one step further in that, in addition to forming the trenches of a single damascene, hole openings are also formed at appropriate places in the trench further into the insulative layer. The resulting composite structure of trenches and holes are filled with metal. The process is repeated as many times as required to form the multi-level interconnections between metal lines and the holes formed therebetween.

In one approach for a dual damascene process shown in FIG. 1a, two insulative layers (120) and (130) are formed on a substrate (100) with an intervening etch-stop layer (125). Substrate (100) is provided with metal layer (110) and a barrier layer (115). Metal layer can be the commonly used aluminum or copper, while the barrier can be an oxide layer. A desired trench or trench pattern (150) is first etched into the upper insulative material (130) using conventional photolithographic methods and photoresist (140). The etching stops on etch-stop layer (125). Next, a second photoresist layer (160) is formed over the substrate, thus filling the trench opening (150), and patterned with hole opening (170), as shown in FIG. 1b. The hole pattern is then etched into the lower insulative layer (120) as shown in FIG. 1c and photoresist removed, thus forming the dual damascene structure shown in FIG. 1f.

Or, the order in which the trench and the hole are formed can be reversed. Thus, the upper insulative layer (130) is first etched, or patterned, with hole (170), as shown in FIG. 1d. The hole pattern is also formed into etch-stop layer (125). Then, the upper layer is etched to form trench (150) while at the same time the etching transfers the hole pattern in the etch-stop layer into lower insulation layer (120), as shown in FIG. 1e. It will be noted that the etch-stop layer stops the etching of the trench into the lower insulation layer. After the completion of the thusly formed dual damascene structure, both the hole opening and trench opening are filled with metal (180), and any excess material on the surface of the substrate is removed by chemical mechanical polishing, as seen in FIG. 1f.

However, when trench (150), or hole (170) openings are formed through the insulative layers (120) and (130) as shown in FIGS. 1b-1e, moisture (190) is absorbed from the atmosphere by the exposed dielectric layers on the sidewalls of the openings. After copper (180) is deposited, moisture (190) is then released from the dielectric layers. This moisture diffuses into the metal causing poisoned via/contact metallurgy.

A method for forming a dual damascene structure with a low-k dielectric material is disclosed in U.S. Pat. No. 5,916,823 as cited by Lou, et al., with the steps of: forming a liner oxide layer onto the substrate; forming a first low k dielectric layer atop the liner oxide layer; forming a cap oxide layer atop the first low-k dielectric layer; forming a first nitride layer atop the cap oxide layer; patterning and etching the first nitride layer to form a contact opening; forming a second low-k dielectric layer into the contact opening and atop the first nitride layer; forming a second nitride layer atop the second low-k dielectric layer; forming a photoresist layer atop the second nitride layer; patterning and developing the photoresist layer to expose a trench opening, wherein the trench opening is of different dimension than the contact opening; forming a dual damascene opening by etching the second nitride layer and the second low-k dielectric layer, using the photoresist layer as a mask, and by etching the cap oxide layer, the first low-k dielectric layer and the liner oxide layer, using the first nitride layer as a mask; stripping the photoresist layer; forming oxide side spacers into the dual damascene opening; and depositing a conductive layer into the dual damascene opening.

A different dual damascene structure with a dielectric layer, and process for manufacturing it, are described in U.S. Pat. No. 6,140,220 by Lin where a via bole is first lined with a layer of silicon nitride prior to adding the diffusion barrier and copper. This allows use of a barrier layer that is thinner than normal (since the silicon nitride liner is an effective diffusion barrier) so that more copper may be included in the via hole, resulting in an improved conductance of the via. The process relies upon the careful control of the etching process. In particular, the relative selectivity of the etch between silicon oxide and silicon nitride must be carefully adjusted.

Still another method of forming a dual damascene structure is disclosed in U.S. Pat. No. 6,074,942 by Lou. The method comprises the steps of: forming an insulating layer on said substrate; forming a nitride layer over said insulating layer; forming a cap oxide layer over said nitride layer; patterning and etching said insulating layer, nitride layer, and cap oxide layer to correspond to the location of said contacts; patterning and etching said nitride layer and said cap oxide layer to correspond to the pattern of said interconnects; and performing a reflow step.

It is disclosed in the present invention a different method of forming a dual damascene interconnect where the low-k dielectric layers are protected by a metal layer in order to prevent the occurrence of poisoned vias.

SUMMARY OF THE INVENTION

It is therefore an object of the present invention to provide a method of forming vias in low-k dielectric materials without the attendant via poisoning problem.

It is another object of the present invention to provide a method of forming a protective layer on an around low-k porous dielectric materials to prevent outgassing and the attendant via poisoning when forming copper vias in them.

It is yet another object of the present invention to provide a method of forming dual damascene structures without via poisoning when formed in low-k porous dielectric materials.

These objects are accomplished by providing a substrate having a passivation layer formed over a first metal layer formed on a substrate; forming a first insulative layer over said substrate; forming an etch-stop layer over said first insulative layer; forming a second insulative layer over said etch-stop layer; forming a first photoresist layer over said second insulative layer and patterning said photoresist to form a first photoresist mask having a hole pattern; etching said first and second insulative layers, including said etch-stop layer through said hole pattern to form a hole reaching said passivation layer; removing said first photoresist mask; forming a low-k protection layer over said substrate, including in said hole opening; forming a second photoresist layer over said substrate, including said hole opening and patterning said second photoresist to form a second photoresist mask having a trench pattern; etching said second insulative layer through said trench pattern in said second photoresist mask to form a trench in said second insulative layer, thus completing the forming of said dual damascene structure in said substrate; removing said second photoresist mask; removing said low-k protection layer from over said substrate and from the bottom of said hole opening and thereby exposing underlying said passivation layer while leaving said low-k protection layer on the vertical sides of said hole opening; removing said passivation layer from said bottom of said hole opening, thereby exposing underlying said first metal layer; forming a barrier layer over said substrate, including in said dual damascene structure; depositing a second metal over said barrier layer in said dual damascene structure; and performing chemical mechanical polishing (CMP) to complete the forming of said dual damascene structure.

These objectives are further accomplished by providing a substrate having a damascene structure with an upper trench opening and a lower hole opening formed in a low-k dielectric layer; a low-k protection layer on the inside walls of said lower hole opening; a barrier layer over said low-k protection layer on said inside walls of said lower hole opening, and on the inside walls of said trench opening; and a metal layer deposited in said dual damascene structure.

BRIEF DESCRIPTION OF THE DRAWINGS

FIGS. 1a-1c show the forming of a dual damascene structure where a line trench is etched first into an upper second dielectric layer until an etch-stop layer is reached, and then the hole pattern etched into the lower first dielectric layer, according to prior art.

FIGS. 1d-1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a-1c or FIGS. 1d-1e, according to prior art.

DESCRIPTION OF THE PREFERRED EMBODIMENTS

Referring now the drawings, FIGS. 2a-2i, there is shown a method of reducing via poison in low-k Cu dual damascene structures through a protective layer that is formed. It will be apparent to those skilled in the art that the disclosed method will be especially suitable for porous low-k dielectric materials in which a single via or a dual damascene structure is formed. This is because, the protective layer that is disclosed prevents any outgassing from the porous low-k dielectric layer that may have harbored moisture and impurities during the earlier various process steps, and any detrimental effects thereof during the subsequent steps of depositing metal in the single or the dual damascene structure.

Figure 2A:
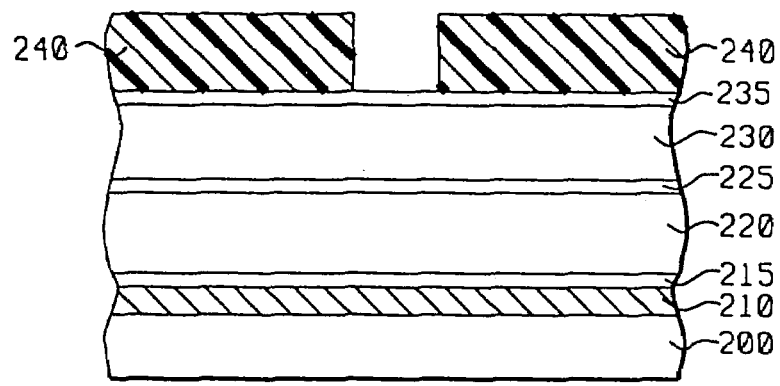
FIG. 2a is a partial cross-sectional view of a substrate showing the forming of a first photoresist mask over a passivation layer covering two underlying insulative layers separated from each other with an intervening etch-stop layer, according to the present invention.

Specifically, FIG. 2a shows a portion of a semiconductor substrate (200), which is preferably silicon.

In FIG. 2a, the substrate is provided with first metal layer (210) and a passivation layer (215). Metal is preferably copper with a thickness between about 1000 to 10000 Å, and the passivation layer comprises oxide, nitride or carbide with a thickness between about 30 to 50 Å. It will be noted, however, that the presently disclosed method is applicable to forming a dual damascene interconnect to connect to either the substrate, that is, to form a contact, as is known in the art, or to connect to an underlying metal layer, to form a via. In other words, the method can be employed for forming either damascene contacts or vias.

First dielectric layer (220) is formed over the passivation layer, comprising a material of low dielectric constant (low-k). Some of the conventional low-k materials are usually fluorinated, such as the amorphous fluorinated carbon ($\alpha$-C:F), poly-tetra-fluoro-ethylene (PTFE), fluorinated polyimide, fluorinated or $SiO_2$, phosphosilicate glass (PSG). However, defluoriniation occurs with these materials, which then reacts with barrier materials and causes delamination. Barrier materials are used because, copper unfortunately suffers from high diffusivity in these insulating materials. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. Sometimes, a barrier layer alone is not sufficient where the underlying low-k material is also porous. Then, the surface is rough and the barrier layer is not sufficient to provide a thick enough a smooth surface for the metal to be deposited later to adhere well. Thus, this invention discloses an additional low-k protection layer which provides not only an additional barrier layer, but also a smooth surface for good adhesion. It is preferred that the first low-k dielectric layer is chosen from among materials such as black diamond, FLARE, SILK having dielectric constants between about 2.0 to 3.0 and formed by CVD or spinning on to a thickness between about 2000 to 100000 Å.

Next, an etch-stop, layer (225) shown in FIG. 2a is formed over the first dielectric layer. The etch-stop layer is preferably silicon nitride formed by reacting dichlorosilane ($SiCl_2H_2$), or silane ($SiH_4$), with ammonia ($NH_3$) in an LPCVD at a temperature between about 350 to 450° C., and to a thickness between about 50 to 1000 Å. This is followed by the forming of second dielectric layer (230), which is also a low-k material chemical vapor deposited or spun on to a thickness between about 2000 to 100000 Å. A second passivation layer (235), same as the first passivation layer (215) as shown in FIG. 2a may also be formed over the second dielectric layer, but is not necessarily required.

Figure 2B:
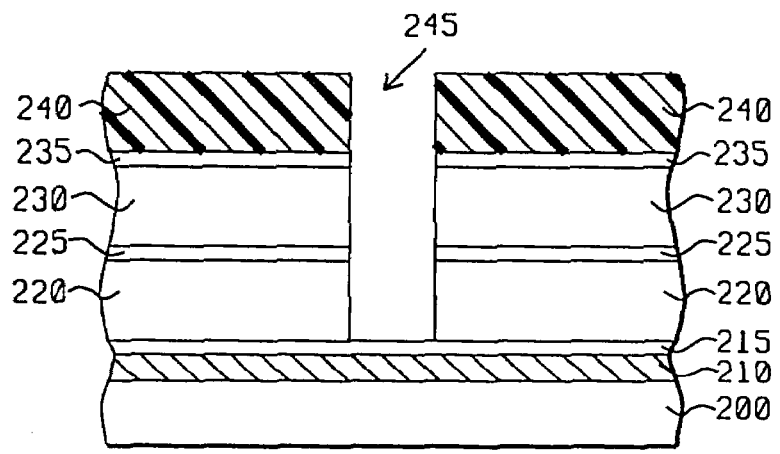
FIG. 2b is a partial cross-sectional view of a substrate showing the forming of a hole opening into the two insulative layers of FIG. 2a, according to the present invention.

Using conventional techniques, first photoresist layer (240) is next formed over the second insulative dielectric layer and then patterned to form a first photoresist mask with the image of a conventional via or a contact hole. Using the photoresist layer as a mask, hole pattern (245) is then etched into the second and first dielectric layers, in that order, including the intervening etch-stop layer (225) as shown in FIG. 2b. After the etching, the photoresist mask is removed, preferably by oxygen plasma ashing.

As it will be appreciated by those skilled in the art, etching process introduces moisture to the insulative layers (220) and (230) comprising the inside walls of the opening (245). This moisture then diffuses into the metal deposited in the opening at a later step. In other words, if not properly protected, the hole openings can be "poisoned" due to outgassing from the insulative layers during the subsequent step of metal deposition, and/or due to the hydrophobic nature of the insulative layers. A poisoned contact hole (reaching the substrate), or a poisoned via hole (connecting another metallized layer) can give rise to voids, cavities for contaminants to enter, poor interfaces between contacting conductors, and, hence, poor connections between interconnects. Also, it is found that low-k materials are susceptible to form interactions with photoresist material, and hence etching can leave behind photoresist residue, which are detrimental in forming poisoned contact/via holes.

Figure 2C:
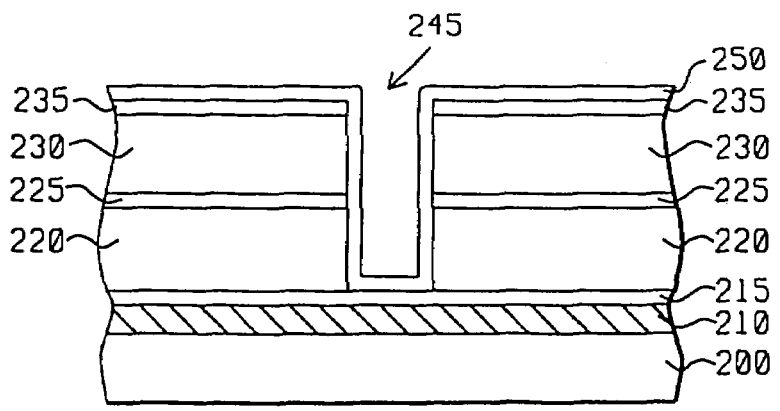
FIG. 2c is a partial cross-sectional view of a substrate showing the forming of a low-k protection layer over the substrate, including the hole opening of FIG. 2b, according to the present invention.

After the removal of the first photoresist mask, it is, therefore, a main feature and key aspect of the present invention to form a protective layer over the exposed surfaces of the low-k dielectric layer to prevent any of the detrimental effects stated above. Thus, low-k protection layer (250) is formed over the substrate, including the lining of the inner walls of hole opening (245), as shown in FIG. 2c. The low-k protection layer is a relatively thin metal liner having a thickness between about 50 to 400 Å, and comprising any of the following: titanium nitride (TiN), titanium tungsten (TiW), titanium silicon nitride (TiSiN), tantalum nitride (TaN), tungsten nitride (WN), or materials like silicon dioxide ($SiO_2$), silicon nitride (SiN), silicon carbide (SiC), silicon nitrocarbide (SiNC), or silicon carbonitride (SiCN).

Figure 2D:
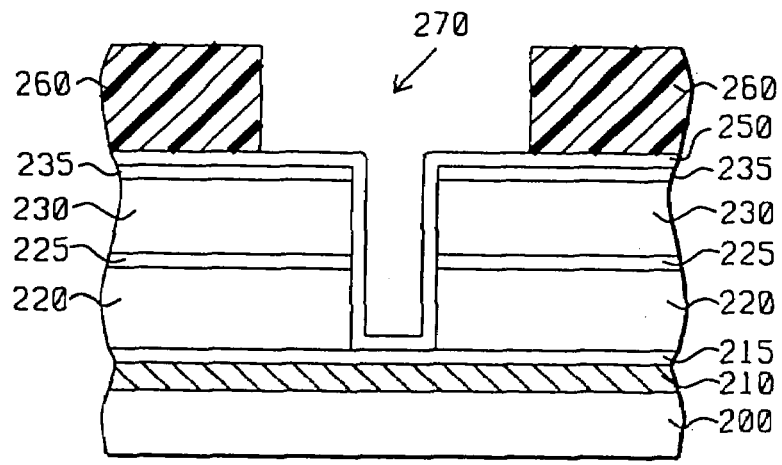
FIG. 2d is a partial cross-sectional view of a substrate showing the forming of a second photoresist mask having a line trench pattern, according to the present invention.
Figure 2E:
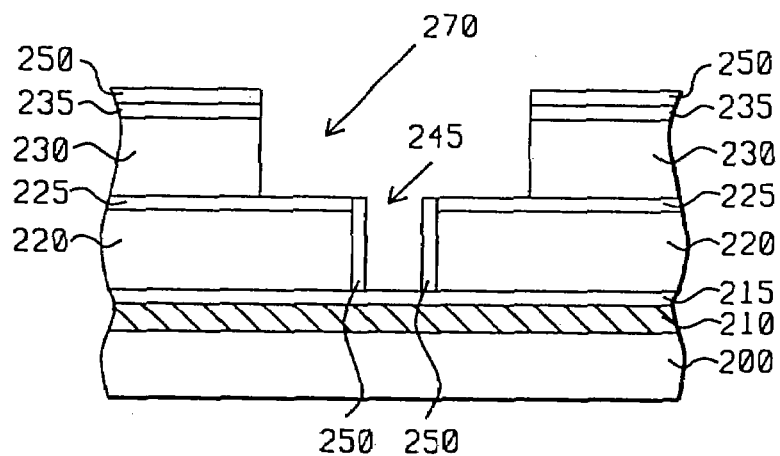
FIG. 2e is a partial cross-sectional view of a substrate showing the transferal of the trench pattern into the second insulative layer, according to the present invention.
Figure 2F:
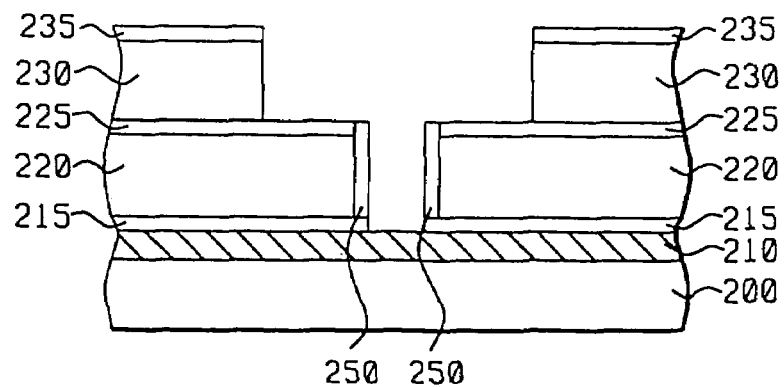
FIG. 2f is a partial cross-sectional view of a substrate showing the exposing of the bottom of the hole to the underlying first metal layer while leaving the low-k protection layer of the invention on the vertical walls of the hole opening, according to the present invention.

Next, second photoresist layer (260) is formed over the substrate, including the opening formed in the previous step, and patterned with the image of a line to form a second photoresist mask with a trench (270) as shown in FIG. 2d. The line pattern is next transferred from the second photoresist mask into the second dielectric layer by etching and stopping on etch-stop layer (225). This is accomplished by etching the second low-k dielectric layer by using a recipe comprising $C_2F_6$, $C_4F_8$, Ar; $N_2$ AND $O_2$. It will be noted that the low-k protection layer (250) is also removed from the bottom of hole opening (245) thereby exposing the underlying passivation layer, while leaving the protective layer on the vertical walls of the hole, as seen in FIG. 2e. Then passivation layer (215) is removed from the bottom of the hole opening using a recipe comprising $C_2F_6$, $C_4F_8$, Ar, $N_2$ and $O_2$, and exposing the underlying first metal layer (210), as shown in FIG. 2f. This is followed by the removal of the second photoresist layer, hence completing the forming of a damascene structure having a composite hole (245) and line (270) pattern as shown in FIG. 2f.

Figure 2G:
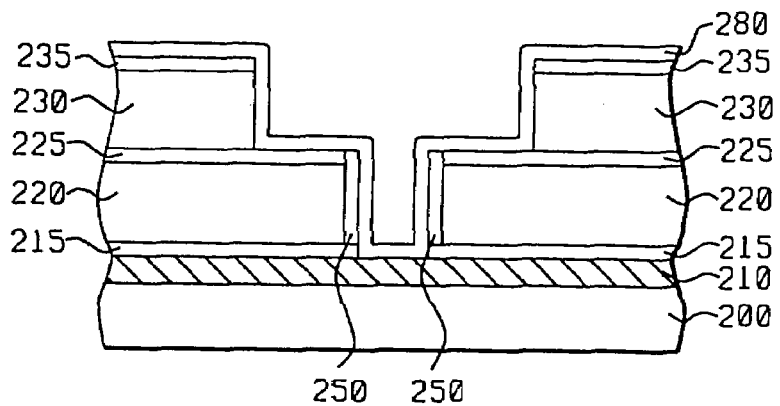
FIG. 2g is a partial cross-sectional view of a substrate showing the forming of a barrier layer on the inside walls of the dual damascene structure of FIG. 2f, where the vertical walls of the hole opening is also covered with the low-k protection layer of this disclosure, according to the present invention.

As another key aspect of the present invention, a barrier to copper diffusion, namely, layer (280), is formed over the inner-walls of the dual damascene structure of the invention, as shown in FIG. 2g. It is preferred that the barrier layer comprises chemical vapor deposited (CVD) TaN, or CVD TiN, or CVD WN, or CVD TiSiN, and similar materials. However, it will be noted that while the barrier layer is formed directly over the inside walls of the trench opening, including the bottom wall of the trench, and also the bottom of the hole opening, it is formed over the low-k protection layer on the vertical walls of the hole opening, as seen in FIG. 2g. In other words, the low-k protection layer of the invention, and the barrier layer overlying it provide a double protection against via poisoning in the dual damascene.

Figure 2H:
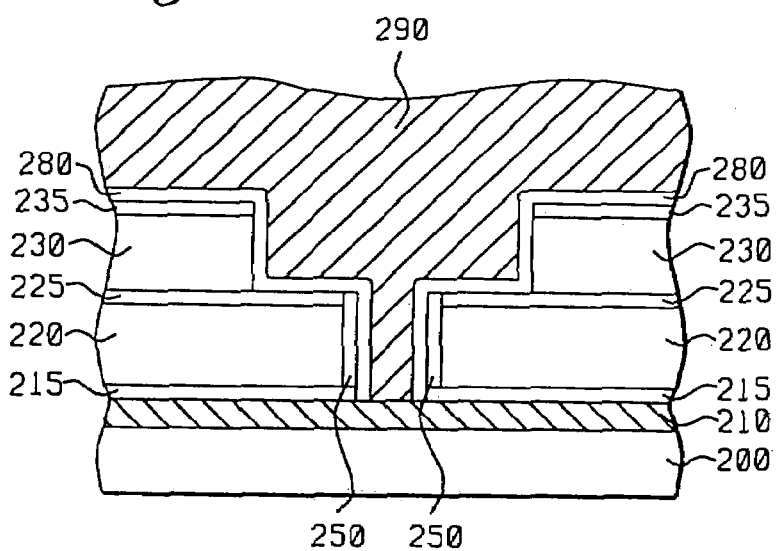
FIG. 2h is a partial cross-sectional view of a substrate showing the forming of metal into the dual damascene structure of FIG. 2g, according to the present invention.
Figure 2I:
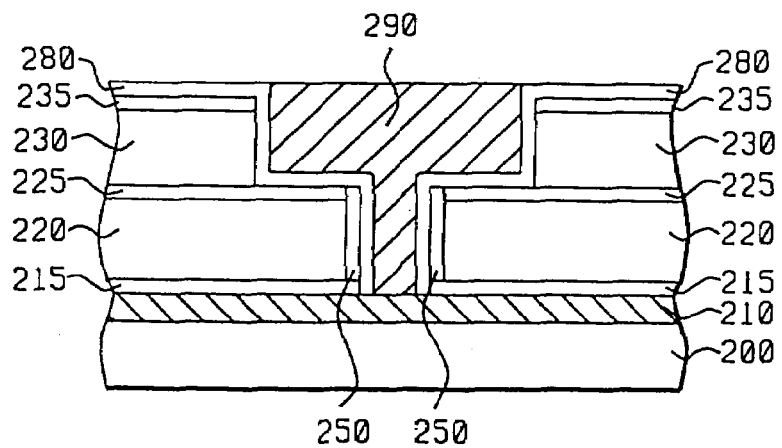
FIG. 2i is a partial cross-sectional view of a substrate showing the chemical mechanical polishing (CMP) of any excess metal of FIG. 2h, according to the present invention.

As a penultimate step, copper metal (290) is deposited in the dual damascene structure shown in FIG. 2h and subsequently, any excess metal is removed by any number of conventional techniques, including chemical-mechanical polishing (CMP), as shown in FIG. 2i.

Thus, a Cu dual damascene structure is formed devoid of poisoned vias and/or contacts after having been provided with a low-k protection layer underlying a barrier layer. Though various details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite. For example, though the protection layer is applied to low-k materials here, the same method can be practiced when conventional insulative materials are also used. Also, the same method can be used in single damascene structures.

While the invention has been particularly shown and described with reference to the preferred embodiments thereof, it will be understood by those skilled in the art that various changes in form and details may be made without departing from the spirit and scope of the invention.

What is claimed is:

1. A damascene structure with a protection layer for low-k materials comprising:
   a substrate having a damascene structure with an upper trench opening and a lower hole opening formed in a low-k dielectric layer;
   a low-k protection layer on the vertical walls of said lower hole opening; a barrier layer over said low-k protection layer on said vertical walls of said lower hole opening, and on the vertical walls of said trench opening; and a metal layer deposited in said dual damascene structure;
   wherein said low-k dielectric layer includes at least one of black diamond, CVD SiC, SiLK, and a polymer; and
   wherein said low-k protection layer includes at least one of SiO2, SiN, SiC and SiCN.

2. The damascene structure according to claim 1, including a passivation layer disposed below said low-k dielectric layer with said lower hole opening, said passivation layer having an opening therethrough that is aligned with said lower hole opening.

3. The damascene structure according to claim 1, wherein said low-k dielectric layer includes first and second insulative layers that are each made from a low-k dielectric material, and an etch-stop layer disposed between said first and second insulative layers.

4. The damascene structure according to claim 3, wherein said low-k protection layer is a material that prevents outgassing from said first and second insulative layers.

5. The damascene structure according to claim 3, wherein said first insulative layer has a dielectric constant within a range of about 2.0 to 3.0.

6. The damascene structure according to claim 3, wherein said first insulative layer has a thickness within a range of about 2000 to 10000 Å.

7. The damascene structure according to claim 3, wherein said etch-stop layer is made of silicon nitride.

8. The damascene structure according to claim 3, wherein said etch-stop layer has a thickness within a range of about 50 to 1000 Å.

9. The damascene structure according to claim 3, wherein said second insulative layer has a dielectric constant within a range of about 2.0 to 3.0.

10. The damascene structure according to claim 3, wherein said second insulative layer has a thickness within a range of about 2000 to 100000 Å.

11. The damascene structure according to claim 1, wherein said low-k protection layer has a thickness within a range of about 20 to 1000 Å.

12. The damascene structure according to claim 1, wherein said barrier layer material includes at least one of Ta, Ti, TaN, TiSiN, TaSiN, and WN.

13. The damascene structure according to claim 1, wherein said barrier layer has a thickness within a range of about 30 to 500 Å.

14. The damascene structure according to claim 1, wherein said metal layer includes copper.

* * * * *